(12) United States Patent
Kim et al.

(10) Patent No.: US 7,463,072 B2
(45) Date of Patent: Dec. 9, 2008

(54) SMALL SWING SIGNAL RECEIVER FOR LOW POWER CONSUMPTION AND SEMICONDUCTOR DEVICE INCLUDING THE SAME

(75) Inventors: Hyun-Jin Kim, Gyeonggi-do (KR);
Seong-Jin Jang, Gyeonggi-do (KR);
Kwang-Il Park, Gyeonggi-do (KR);
Woo-Jin Lee, Gyeonggi-do (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 0 days.

(21) Appl. No.: 11/566,651

(22) Filed: Dec. 4, 2006

(65) Prior Publication Data
US 2007/0188201 A1  Aug. 16, 2007

(30) Foreign Application Priority Data
Feb. 13, 2006  (KR) ...................... 10-2006-0013823

(51) Int. Cl.
*H03B 1/00* (2006.01)

(52) U.S. Cl. ...................... 327/112; 327/387; 327/390; 326/81; 326/86

(58) Field of Classification Search ...................... None
See application file for complete search history.

(56) References Cited

U.S. PATENT DOCUMENTS

| | | | | |
|---|---|---|---|---|
| 4,064,405 A | * | 12/1977 | Cricchi et al. ................. | 326/34 |
| 5,162,677 A | * | 11/1992 | Takahashi ..................... | 326/66 |
| 5,223,751 A | * | 6/1993 | Simmons et al. .............. | 326/81 |
| 6,049,228 A | * | 4/2000 | Moon .......................... | 326/81 |
| 2006/0125521 A1 | * | 6/2006 | Kim .............................. | 326/81 |

FOREIGN PATENT DOCUMENTS

| | | |
|---|---|---|
| KR | 2000-0020964 | 4/2000 |
| KR | 2004-0012133 | 2/2004 |

* cited by examiner

*Primary Examiner*—An T Luu
(74) *Attorney, Agent, or Firm*—Marger Johnson & McCollom, P.C.

(57) ABSTRACT

A circuit including a voltage boost circuit coupled to a first node and a second node, and configured to apply a boosted first node voltage to the second node; and an inverter circuit coupled to the first node, the second node, and a third node, and configured to generate a signal on the third node in response to the signals on the first node and the second node.

13 Claims, 6 Drawing Sheets

SMALL SWING SIGNAL RECEIVER FOR LOW POWER CONSUMPTION AND SEMICONDUCTOR DEVICE INCLUDING THE SAME

This application claims the priority of Korean Patent Application No. 10-2006-0013823, filed on Feb. 13, 2006, in the Korean Intellectual Property Office, the disclosure of which is incorporated herein in its entirety by reference.

BACKGROUND

1. Technical Field

This disclosure relates to a semiconductor device, and more particularly, to a small swing signal receiver and a semiconductor device including the same.

2. Description of the Related Art

In semiconductor devices, a level of an externally input signal may be different from a level of an internal signal. In this case, a signal receiver that receives the externally input signal and converts it into a higher level (for example, a complementary metal-oxide semiconductor (CMOS) level) is required. In addition, various signals need to be transmitted from a peripheral circuit to a core circuit or vice versa with semiconductor devices. Here, power consumption is high if a full-swing signal (e.g., a signal swinging between ground and a power supply voltage level) is transmitted. Accordingly, it is usual to transmit a small swing signal (hereinafter, referred to as a "small signal") having a smaller swing amplitude (level) than the full-swing signal. A small signal receiver is required to receive the small signal.

However, when the design of a small signal receiver is not appropriate, reception characteristics are deteriorated. For example, a duty ratio of an input signal may deviate from a desired amount. In addition, current consumption of the signal receiver affects the entire power consumption of a semiconductor device. Such current consumption may come from leakage current in the small signal receiver.

Figure 1:
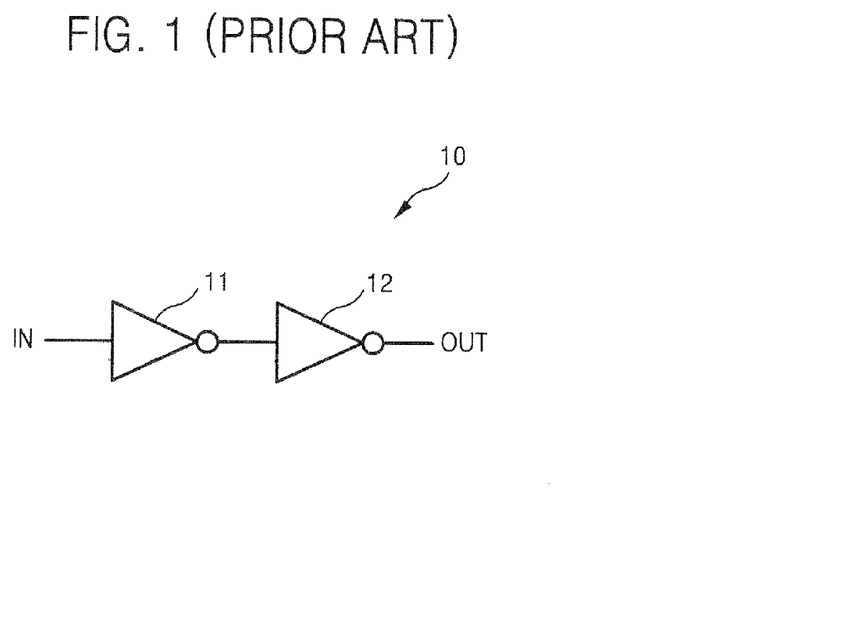
FIGS. 1 and 2 are circuit diagrams of conventional signal receivers for semiconductor devices.
Figure 2:
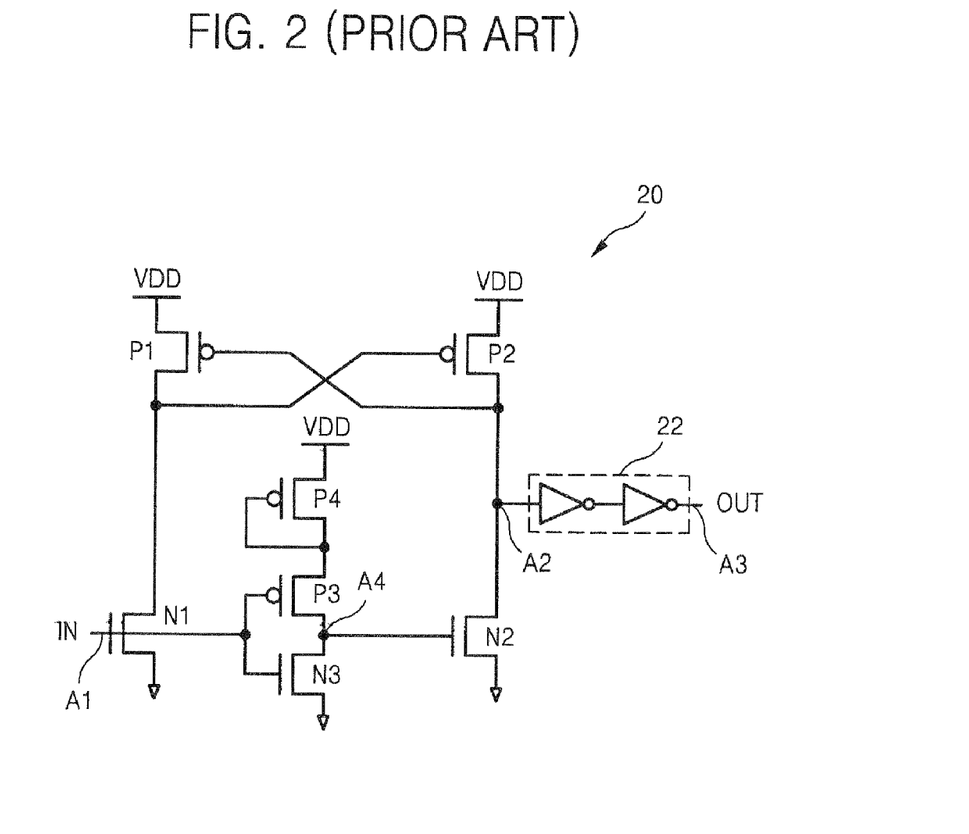

FIGS. 1 and 2 are circuit diagrams of conventional signal receivers 10 and 20 for semiconductor devices.

The signal receiver 10 illustrated in FIG. 1 is a buffer type. The buffer-type signal receiver 10 includes two inverters 111 and 12 connected in series. Although not shown in detail, each of the inverters 11 and 12 usually includes a PMOS transistor and an NMOS transistor connected in series between a power supply and a ground. Since the PMOS transistor and the NMOS transistor operate in response to the same input signal, the two transistors may be turned on simultaneously at a level where the input signal transitions. Thus, a current path is formed from the power supply to the ground, increasing leakage current. As a result, the buffer-type signal receiver 10 has high current consumption due to leakage current.

The receiver 20 illustrated in FIG. 2 is a conventional level shifter. The level shifter 20 includes multiple NMOS transistors N1, N2, and N3; multiple PMOS transistors P1, P2, P3, and P4; and a buffer 22.

Figure 5A:
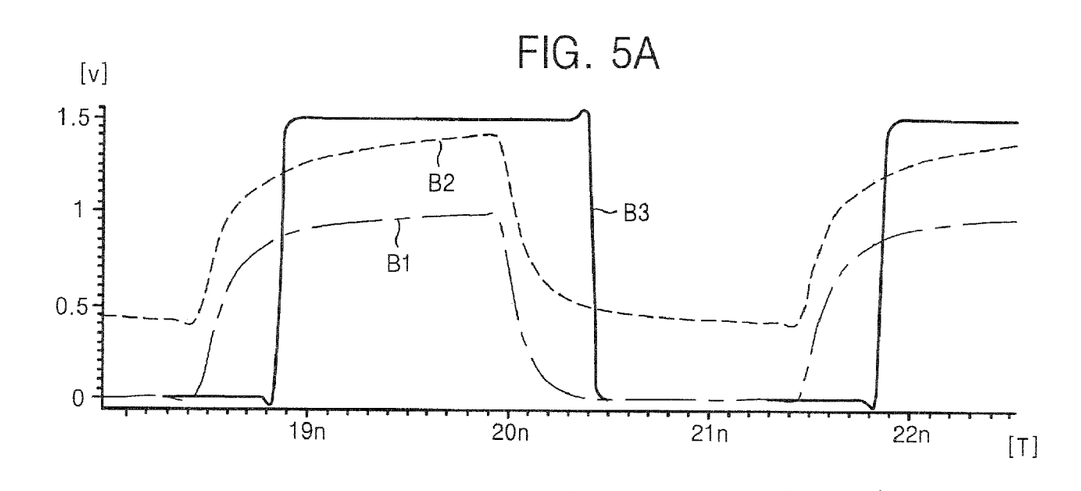
FIGS. 5A and 5B are graphs illustrating signal waveforms of the signal receiver illustrated in FIG. 4 and a level shifter illustrated in FIG. 2.
Figure 5B:
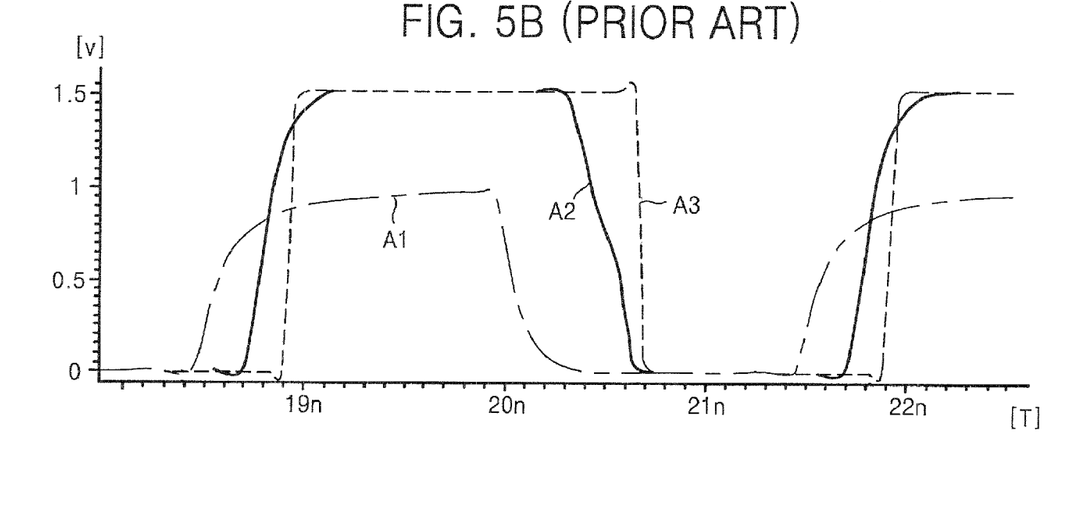

FIG. 5B illustrates signal waveforms of the level shifter 20 illustrated in FIG. 2. The operation of the level shifter 20 will be described with reference to FIGS. 2 and 5B below.

An input signal IN input to a node A1 is a small signal swinging between 0 V and 1V, as illustrated in FIG. 5B. A power supply voltage (VDD) is about 1.5 V.

When the input signal IN is at a high level, the first NMOS transistor N1 is turned on. As a result, the second PMOS transistor P2 is also turned on. In addition, the third NMOS transistor N3 is turned on, and therefore, the second NMOS N2 is turned off. Accordingly, a voltage at a node A2 transitions to a high level close to a VDD level. Thus an output signal OUT also transitions to a high level.

When the input signal IN is at a low level, the first and third NMOS transistors N1 and N3 are turned off and the third PMOS transistor P3 is turned on. Thus, the second NMOS transistor N2 is turned on. Accordingly, the voltage at the node A2 transitions to a low level and the output signal OUT also transitions to a low level. However, when the VDD is low, for example, when the VDD is lower than 1.5 V, the stack PMOS transistor P4 does not operate properly. In particular, when the input signal IN is at the low level, a voltage level of a signal input to a gate of the second NMOS transistor N2 is not sufficiently high and thus the second NMOS transistor N2 may not be turned on timely. For this reason, there may be a difference between a high level section and a low level section of the output signal OUT (expressed by an A3 graph in FIG. 5B).

The level shifter 20 illustrated in FIG. 2 has lower current consumption than the signal receiver 10 illustrated in FIG. 1 since leakage current is reduced. However, the level shifter 20 also has a problem in that a duty ratio is distorted in a low-voltage environment.

SUMMARY

An embodiment includes a circuit including a voltage boost circuit coupled to a first node and a second node, and configured to apply a boosted first node voltage to the second node; and an inverter circuit coupled to the first node, the second node, and a third node, and configured to generate a signal on the third node in response to the signals on the first node and the second node.

Another embodiment includes a method of operating a semiconductor device including receiving an input signal, boosting a voltage of the input signal to generate a boosted signal, pulling up an output node in response to the boosted signal, and pulling down the output node in response to the input signal.

BRIEF DESCRIPTION OF THE DRAWINGS

The above and other features and advantages will become more apparent by describing embodiments in detail with reference to the attached drawings in which.

DETAILED DESCRIPTION

Hereinafter, embodiments will be described in detail with reference to the attached drawings such that one skilled in the art will gain an understanding of the spirit and scope of the following claims. Like reference numerals in the drawings denote like elements.

Figure 3:
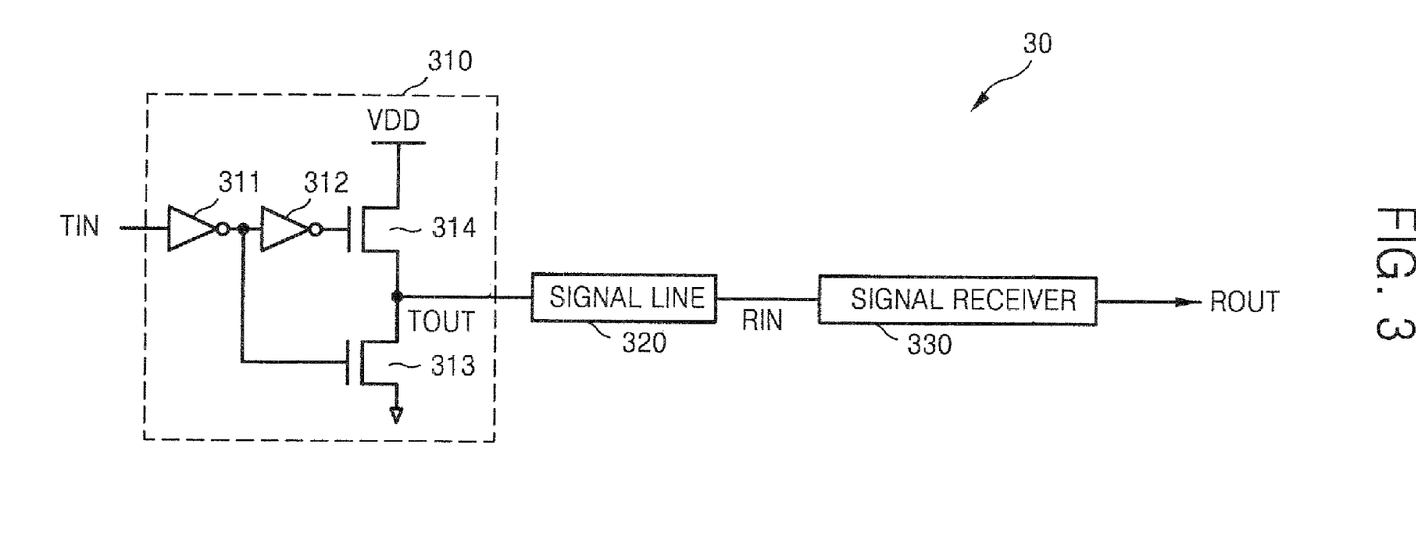
FIG. 3 is a block diagram of a semiconductor device according to an embodiment.

FIG. 3 is a block diagram of a semiconductor device 30 according to an embodiment. The semiconductor device 30 includes a signal transmitter 310, a signal line 320, and a signal receiver 330. The signal transmitter 310 is configured to generate a small swing signal (referred to as a "small signal") and transmit it to the signal receiver 330 via the signal line 320.

In this embodiment, the signal transmitter 310 includes a first NMOS transistor 313, a second NMOS transistor 314, a first inverter 311, and a second inverter 312. The first NMOS transistor 313 is turned on or off in response to an output signal of the first inverter 311 and the second NMOS transistor 314 is turned on or off in response to an output signal of the second inverter 312. In the signal transmitter 310, the two NMOS transistors 314 and 313 instead of a PMOS transistor and an NMOS transistor are connected in series between a power supply voltage (VDD) and a ground. Thus, a voltage level of an output signal TOUT does not swing between a ground voltage (i.e., 0 V) and the VDD but swings between the 0 V and (VDD-Vth). In other words, the output signal TOUT is not a full-swing signal (0 to VDD) but a small swing signal (0 to (VDD-Vth)). Here, Vth denotes a threshold voltage of the second NMOS transistor 314.

The signal receiver 330 is configured to receive a small signal through the signal line 320 and converts the level of the small signal. The signal line 320 may be a variety of types of lines, including a data line or an address line according to a type of transmitted signal. For example, when the semiconductor device 30 is a memory device, the signal transmitter 310 and the signal receiver 330 may be used in one or more of a path for transmitting an externally input data signal to a core memory, a reversed path, and a path for transmitting an address signal (or a decoded address signal).

Figure 4:
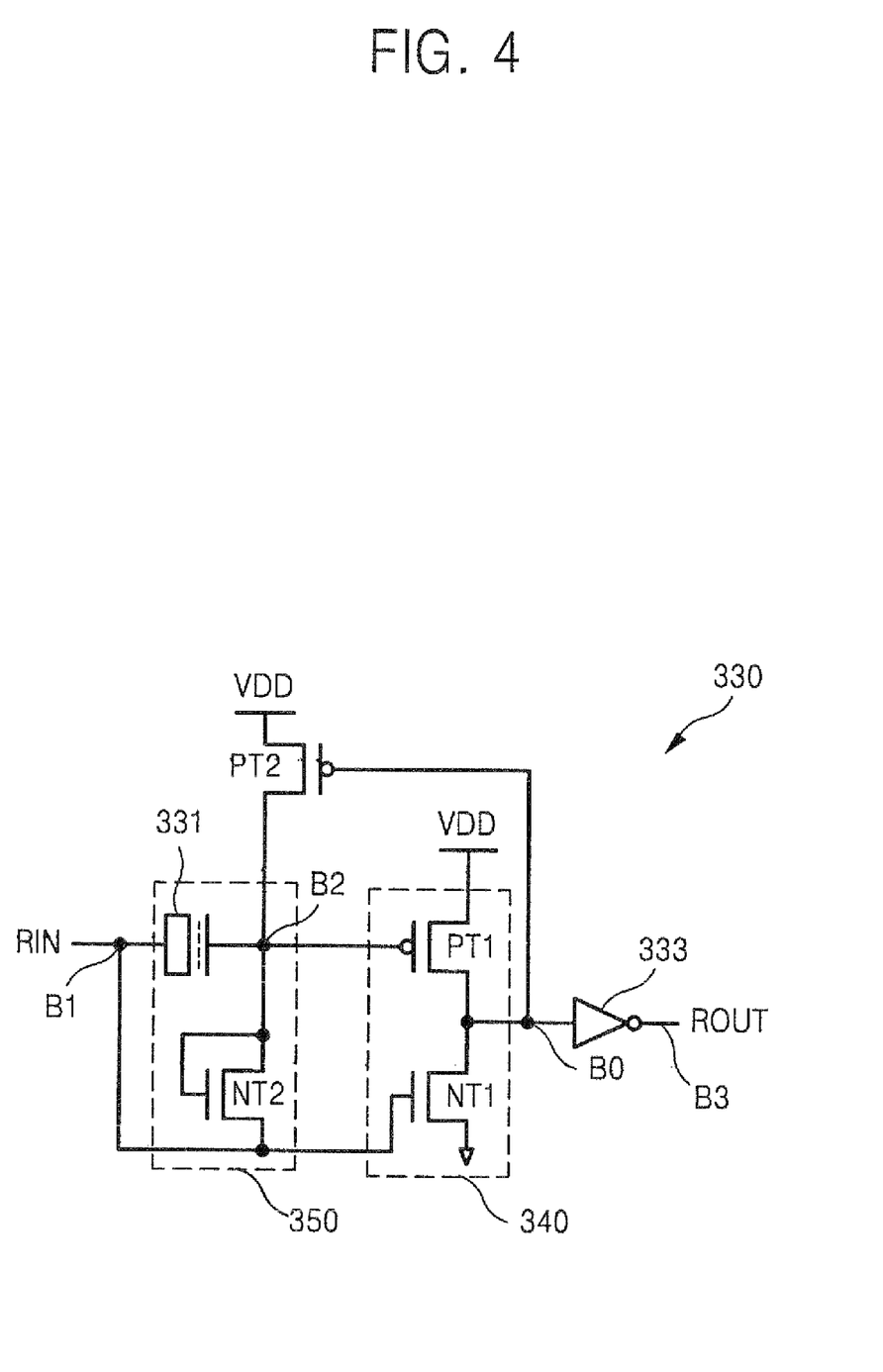
FIG. 4 is a circuit diagram of a signal receiver illustrated in FIG. 3.

FIG. 4 is a circuit diagram of the signal receiver 330 illustrated in FIG. 3. Referring to FIG. 4, the signal receiver 330 includes a modified inverter circuit 340 including a first NMOS transistor NT1 and a first PMOS transistor PT1, a voltage booster 350, a second PMOS transistor PT2, and an inverter 333.

The first NMOS transistor NT1 is coupled between a node B0 and a first power supply (here, a ground) and is configured to operate in response to a reception signal RIN. The first PMOS transistor PT1 is coupled between the node B0 and a second power supply VDD and is configured to operate in response to a signal (i.e., a signal at a node B2) obtained by boosting the reception signal RIN by a predetermined voltage.

The voltage booster 350 includes a capacitor 331 and a second NMOS transistor NT2 and is configured to boost the reception signal RIN so that a voltage at the node B2 is higher than a voltage of the reception signal RIN by a predetermined level.

The capacitor 331 is coupled between a reception node B1 and the node B2 and is configured to receive the reception signal RIN. The capacitor 331 is configured to boost the reception signal RIN in an initial operating stage of the signal receiver 330 so that the voltage at the node B2 is higher than the voltage of the reception signal RIN. The capacitor 331 may be implemented by a variety of types of capacitors, including a capacitor implemented by a depletion NMOS transistor. A drain and a gate of the second NMOS transistor NT2 are coupled to the node B2 in common and a source thereof is coupled to the reception node B1. Thus, the second NMOS transistor NT2 is configured to operate as a diode. Due to the operations of the capacitor 331 and the diode NT2 coupled between the reception node B1 and the node B2, the voltage at the node B2 is higher than the voltage of the reception signal RIN by the predetermined level. Here, a boosting level is determined according to the size of the capacitor 331 and the threshold voltage of the second NMOS transistor NT2.

Although a capacitor has been described as boosting the reception signal RIN, other circuits that can increase a voltage of a signal may be used. Such circuits are commonly referred to as boost elements. In addition, although a diode-coupled transistor has been described as part of the voltage booster 350, other configurations and structures of diodes may be used.

The second PMOS transistor PT2 has a source coupled to the second power supply VDD, a drain coupled to the node B2, and a gate coupled to the node B0. The second PMOS transistor PT2 quickly increases the level of the voltage at the node B2 when the reception signal RIN is at a high level so that the first PMOS transistor PT1 is quickly turned off. As a result, the second PMOS transistor PT2 prevents both of the first PMOS transistor PT1 and the first NMOS transistor NT1 from being in an on-state simultaneously.

FIG. 5A illustrates signal waveforms of the signal receiver 330 illustrated in FIG. 4. In detail, FIG. 5A illustrates signal waveforms at the nodes B1, B2, and B3 when a signal transmitted from the signal transmitter 310 illustrated in FIG. 3 is received by the signal receiver 330. The operations of the signal receiver 330 will be described with reference to FIGS. 4 and 5A below.

The reception signal RIN is boosted by the capacitor 331 and the second NMOS transistor NT2 acting as a diode so that a signal at the node B2 is higher than the reception signal RIN (expressed by a B1 graph in FIG. 5A) by a predetermined voltage (e.g., about 0.4 V). In an embodiment, a power supply voltage may be about 1.5 V. The reception signal RIN is a signal that is transmitted from the signal transmitter 310 and swings between about 0 V and 1 V. The signal at the node B2 has a similar waveform to that of the reception signal RIN (i.e., the B1 graph) but swings at an about 0.4 V higher level than the reception signal RIN.

When the reception signal RIN is at a high level of about 1 V, the first NMOS transistor NT1 is turned on. Thus, a voltage at the node B0 transitions to a low level and an output signal ROUT transitions to a high level close to the VDD, i.e., 1.5 V. Here, the voltage at the node B2 is at a high level and thus the first PMOS transistor PT1 is turned off. In addition, since the voltage at the node B0 is at the low level, the second PMOS transistor PT2 is turned on. The second PMOS transistor PT2 makes the voltage at the node B2 have a level of the second power supply VDD, thereby preventing the first PMOS transistor PT1 from being turned on. In other words, the second PMOS transistor PT2 is turned on in response to an output signal of the modified inverter circuit 340 (i.e., the signal at the node B0) when the reception signal RIN is at the high level and quickly increases the voltage level of the signal at the node B0 so that the first PMOS transistor PT1 is quickly turned off. As a result, the first PMOS transistor PT1 and the first NMOS transistor NT1 are prevented from simultaneously being in an on-state, and therefore, leakage current does not flow.

When the reception signal RIN is at a low level, the first NMOS transistor NT1 is turned off and the voltage at the node B2 becomes higher than a ground voltage but is low enough to turn on the first PMOS transistor PT1. Accordingly, the first PMOS transistor PT1 is turned on and the voltage at the node B0 transitions to a high level. As a result, the output signal ROUT is at a low level close to 0 V.

As described above, the signal receiver 330 controls the first NMOS transistor NT1 and the first PMOS transistor PT1 included in the modified inverter circuit 340 using different signals. In other words, while the reception signal RIN is input to a gate of the first NMOS transistor NT1, a signal a predetermined voltage higher than the reception signal RIN is input to a gate of the first PMOS transistor PT1. Accordingly, even at the level transition of the reception signal RIN, the first NMOS transistor NT1 and the first PMOS transistor PT1 are not turned on simultaneously. Accordingly, leakage current is decreased.

In addition, as illustrated in FIG. 5A, a high level section is almost balanced with a low level section in the output signal ROUT expressed by a B3 graph. As compared to the output signal OUT expressed by the A3 graph in FIG. 5B, a duty ratio of the output signal ROUT of the signal receiver 330 is improved.

Figure 6:
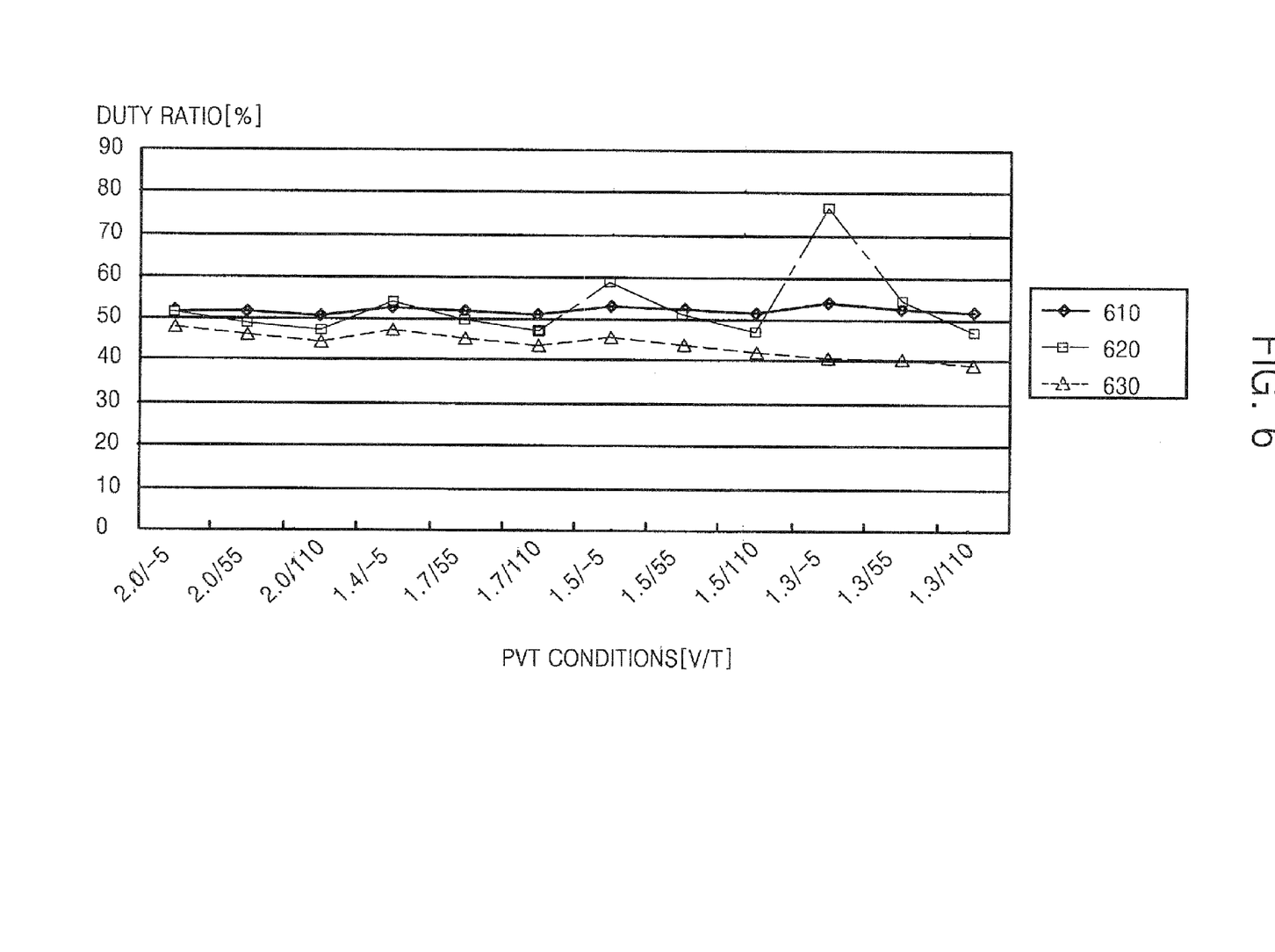
FIG. 6 is a graph of comparison in a duty ratio between a conventional signal receiver and a signal receiver according to an embodiment.

FIG. 6 is a graph of comparison in a duty ratio between the conventional signal receivers 10 and 20 and a signal receiver 330 according to an embodiment. FIG. 6 illustrates the change in a duty ratio with respect to power-voltage-temperature (PVT) conditions, and particularly, a voltage and temperature (V/T) condition in the conventional signal receivers 10 and 20 and the signal receiver 330.

A graph 610 shows a duty ratio of the output signal OUT of the buffer-type signal receiver 10 illustrated in FIG. 1. A graph 620 shows a duty ratio of the output signal OUT of the level shifter type signal receiver 20 illustrated in FIG. 2. A graph 630 shows a duty ratio of the output signal ROUT of the signal receiver 330 illustrated in FIG. 4.

Referring to the graph 620, the level shifter type signal receiver 20 illustrated in FIG. 2 has a duty ratio deviating significantly from 50% in a low-voltage environment (e.g., less than 1.5 V). The duty ratio is about 80% at certain conditions, in which the signal receiver 20 cannot receive signals properly. In contrast, referring to the graph 630, the duty ratio of the output signal ROUT of the signal receiver 330 does not have such a pronounced duty ratio problem at low power voltages.

Figure 7:
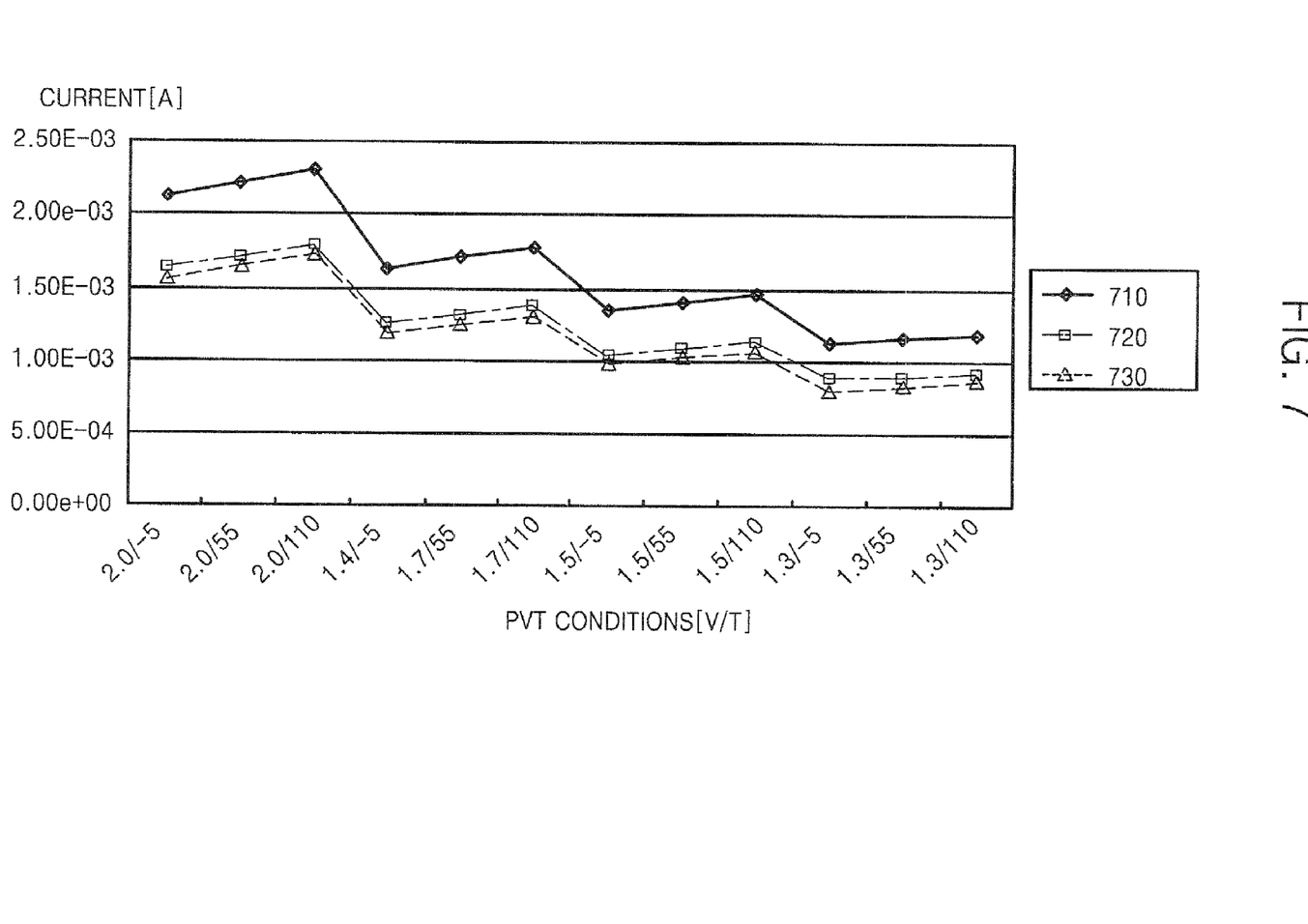
FIG. 7 is a graph of comparison in current between a conventional signal receiver and a signal receiver according to an embodiment.

FIG. 7 is a graph of comparison in current between the conventional signal receivers 10 and 20 and the signal receiver 330 according to the embodiment of the present invention.

A graph 710 shows current in the buffer-type signal receiver 10 illustrated in FIG. 1. A graph 720 shows current in the level shifter type signal receiver 20 illustrated in FIG. 2. A graph 730 shows current in the signal receiver 330 illustrated in FIG. 4. FIG. 7 illustrates the change in current with respect to PVT conditions, and particularly, a V/T condition in the conventional signal receivers 10 and 20 and the signal receiver 330 of the present invention.

Referring to FIG. 7, the amount of current in the signal receiver 330 illustrated in FIG. 4 is remarkably less than that in the buffer-type signal receiver 10 illustrated in FIG. 1 and is also less than that in the level shifter type signal receiver 20 illustrated in FIG. 2.

As described above, according to an embodiment, a duty ratio of a signal does not deteriorate, and current consumption is reduced. In particular, in an environment with many signal lines, such as many data lines, current consumption is reduced. Accordingly, the entire power consumption of a semiconductor device can be reduced.

An embodiment includes a small signal receiver for maintaining a duty ratio of an input signal, even in a low-voltage environment, and reducing current consumption by decreasing leakage current. Another embodiment includes a semiconductor device including such a small signal receiver.

While embodiments have been particularly shown and described with reference to the drawings, it will be understood by those of ordinary skill in the art that various changes in form and details may be made therein without departing from the spirit and scope of the following claims.

What is claimed is:

1. A circuit, comprising:
   a voltage boost circuit coupled to a first node and a second node, and configured to apply a boosted first node voltage to the second node, the voltage boost circuit including:
      a boost element coupled to the first node and the second node; and
      a diode coupled between the first node and the second node; and
   an inverter circuit coupled to the first node, the second node, and a third node, and configured to generate a signal on the third node in response to the signals on the first node and the second node.

2. The circuit of claim 1, wherein:
   the boost element includes a capacitor; and
   the diode includes a diode coupled transistor.

3. The circuit of claim 1, wherein the inverter circuit further comprises:
   a first transistor coupled to a ground, the first node, and the third node; and
   a second transistor coupled to the third node, the second node, and a power supply.

4. The circuit of claim 3, wherein the boosted first node voltage is greater than a voltage on the first node such that the first transistor and the second transistor are not on at substantially the same time.

5. The circuit of claim 4, wherein the boosted first node voltage is greater than a voltage on the first node such that when the voltage on the first node is in a low state, a voltage difference between the second node and the power supply is greater than a threshold voltage of the second transistor.

6. The circuit of claim 3, wherein the boosted first node voltage is greater than a voltage on the first node such that when the voltage on the first node is in a low state, a voltage difference between the second node and the power supply is greater than a threshold voltage of the second transistor.

7. The circuit of claim 3, wherein:
   the first transistor includes a source coupled to the ground, a gate coupled to the first node, and a drain coupled to the third node; and
   the second transistor includes a drain coupled to the third node, a gate coupled to the second node, and a source coupled to the power supply.

8. The circuit of claim 3, further comprising:
   a third transistor coupled to the second node, the third node, and a power supply.

9. The circuit of claim 8, wherein:
   the third transistor includes a drain coupled to the second node, a gate coupled to the third node, and a source coupled to the power supply.

10. A circuit, comprising:
    a voltage boost circuit coupled to a first node and a second node, and configured to apply a boosted first node voltage to the second node, the voltage boost circuit including:
       a boost element coupled to the first node and the second node; and
       a diode coupled between the first node and the second node;

a first transistor coupled to a ground, the first node, and a third node; and a second transistor coupled to the third node, the second node, and a power supply.

11. The circuit of claim 10, wherein:

the boost element includes a capacitor; and the diode includes a diode coupled transistor.

12. The circuit of claim 11, wherein:

the first transistor includes a source coupled to the ground, a gate coupled to the first node, and a drain coupled to the third node; and the second transistor includes a drain coupled to the third node, a gate coupled to the second node, and a source coupled to the power supply.

13. The circuit of claim 12, further comprising:

a third transistor including a drain coupled to the second node, a gate coupled to the thirdnode, and a source coupled to the power supply.

* * * * *

UNITED STATES PATENT AND TRADEMARK OFFICE
CERTIFICATE OF CORRECTION

PATENT NO. : 7,463,072 B2  Page 1 of 1
APPLICATION NO. : 11/566651
DATED : December 9, 2008
INVENTOR(S) : Hyun-Jin Kim et al.

It is certified that error appears in the above-identified patent and that said Letters Patent is hereby corrected as shown below:

Column 1, line 42, the word "111" should read -- 1 1 --;
Column 8, line 7, the word "thirdnode" should read -- third node --.

Signed and Sealed this

Thirty-first Day of March, 2009

JOHN DOLL
*Acting Director of the United States Patent and Trademark Office*